United States Patent
Sun et al.

(10) Patent No.: US 12,557,248 B2
(45) Date of Patent: Feb. 17, 2026

(54) COOLING DEVICE

(71) Applicant: JESS-LINK PRODUCTS CO., LTD., New Taipei (TW)

(72) Inventors: Chi-Hsien Sun, New Taipei (TW); Pei-Fang Wu, New Taipei (TW)

(73) Assignee: JESS-LINK PRODUCTS CO., LTD., New Taipei (TW)

( * ) Notice: Subject to any disclaimer, the term of this patent is extended or adjusted under 35 U.S.C. 154(b) by 176 days.

(21) Appl. No.: 18/405,307

(22) Filed: Jan. 5, 2024

(65) Prior Publication Data

US 2025/0063693 A1   Feb. 20, 2025

(30) Foreign Application Priority Data

Aug. 18, 2023   (TW) .................................. 112131105

(51) Int. Cl.
*H05K 7/20* (2006.01)
*F28F 21/08* (2006.01)

(52) U.S. Cl.
CPC ......... *H05K 7/2039* (2013.01); *F28F 21/081* (2013.01)

(58) Field of Classification Search
CPC . H05K 7/2039; H05K 7/20436; F28F 21/081; F28F 13/00; F28F 2013/001; F28F 2013/006

(Continued)

(56) References Cited

U.S. PATENT DOCUMENTS 4,283,464 A * 8/1981 Hascoe ............... H01L 23/3733
                                                         428/614
5,001,548 A * 3/1991 Iversen ................. H01L 23/473
                                                       257/E23.098
(Continued)

FOREIGN PATENT DOCUMENTS

EP          1981095 A2    10/2008
TW        202040774 A     11/2020
(Continued)

OTHER PUBLICATIONS

Search Report dated Jun. 10, 2024 of the corresponding European patent application No. 24150445.5.
(Continued)

*Primary Examiner* — Claire E Rojohn, III
(74) *Attorney, Agent, or Firm* — HDLS IPR SERVICES; Chun-Ming Shih

(57) ABSTRACT

A cooling device includes a tungsten alloy cooling pad (10), a first substrate (20), a second substrate (30) and multiple connecting columns (40). The tungsten alloy cooling pad (10) is used for being attached on the heat source (H). The first substrate (20) is parallelly superposed on the tungsten alloy cooling pad (10). The second substrate (30) corresponds to the first substrate (20) to be parallelly arranged. Each connecting column (40) is perpendicularly connected between the first substrate (20) and the second substrate (30). Each connecting column (40) is arranged in a matrix. Accordingly, the tungsten alloy cooling pad (10) can rapidly disperse and transfer the heat of the heat source (H) to the first substrate (20) and transfer to the second substrate (30) through each connecting column (40) for cooling to avoid heat accumulation leading to overheat.

10 Claims, 4 Drawing Sheets

(58) Field of Classification Search
USPC .............................................. 165/80.2, 80.3
See application file for complete search history.

(56) References Cited

U.S. PATENT DOCUMENTS

| | | | | |
|---|---|---|---|---|
| 5,358,795 | A * | 10/1994 | Nakamura | B23K 20/227 |
| | | | | 428/614 |
| 5,985,464 | A * | 11/1999 | Schmitt | B22D 19/04 |
| | | | | 428/209 |
| 6,129,993 | A * | 10/2000 | Kumamoto | B32B 15/015 |
| | | | | 428/614 |
| 6,992,261 | B2 * | 1/2006 | Kachalov | H01J 37/3435 |
| | | | | 219/93 |
| 7,695,808 | B2 * | 4/2010 | Tuma | C23C 28/341 |
| | | | | 428/323 |
| 10,348,399 | B2 * | 7/2019 | Teranishi | H04B 10/032 |
| 11,205,635 | B2 * | 12/2021 | Huang | H01L 24/32 |
| 11,551,995 | B2 * | 1/2023 | Woods | H01L 23/49827 |
| 2002/0043364 | A1 * | 4/2002 | Suzuki | H01L 21/4878 |
| | | | | 165/185 |
| 2003/0143640 | A1 * | 7/2003 | Ogura | G01N 33/5438 |
| | | | | 506/41 |
| 2006/0246276 | A1 * | 11/2006 | Chung | H01L 23/373 |
| | | | | 428/323 |
| 2007/0102140 | A1 * | 5/2007 | Tuma | H01L 23/3732 |
| | | | | 257/E23.095 |
| 2007/0225532 | A1 * | 9/2007 | Tonkovich | F28F 3/086 |
| | | | | 422/198 |
| 2008/0276624 | A1 * | 11/2008 | Morimoto | H10N 10/13 |
| | | | | 62/3.7 |
| 2013/0128461 | A1 * | 5/2013 | Nagasawa | H01L 23/367 |
| | | | | 165/185 |
| 2016/0324031 | A1 * | 11/2016 | Fujiwara | H01L 23/373 |
| 2020/0275581 | A1 * | 8/2020 | Sawaguchi | H01L 23/3735 |
| 2021/0028342 | A1 * | 1/2021 | Taniguchi | H05K 3/4602 |
| 2022/0352051 | A1 * | 11/2022 | Hsieh | H01L 23/473 |
| 2022/0399248 | A1 * | 12/2022 | Zhang | H01L 23/38 |
| 2022/0412672 | A1 * | 12/2022 | Chen | F28F 3/027 |
| 2023/0105392 | A1 * | 4/2023 | Morita | H10N 10/17 |
| | | | | 136/205 |
| 2023/0124140 | A1 * | 4/2023 | Lee | H10N 10/81 |
| | | | | 136/224 |
| 2023/0360816 | A1 * | 11/2023 | Cabauy | G21H 1/103 |
| 2024/0042163 | A1 * | 2/2024 | Ibano | H10N 10/00 |
| 2024/0241331 | A1 * | 7/2024 | Sun | G02B 6/4261 |
| 2025/0063693 | A1 * | 2/2025 | Sun | H05K 7/2039 |
| 2025/0081387 | A1 * | 3/2025 | Liao | H05K 7/20272 |

FOREIGN PATENT DOCUMENTS

| | | |
|---|---|---|
| TW | M636084 U | 1/2023 |
| WO | 2008045964 A2 | 4/2008 |

OTHER PUBLICATIONS

Office Action dated Jan. 16, 2024 of the corresponding Taiwan patent application No. 112131105.

* cited by examiner

COOLING DEVICE

BACKGROUND

Technical Field

The disclosure relates to a cooling device, particularly to a cooling device that can rapidly transfer heat to perform cooling.

Related Art

At present, common cooling methods for electronic components are mainly divided into two types: active cooling and passive cooling. Among them, the active cooling includes the compressor system and the thermoelectric cooling which utilizes the Peltier effect formed by a current passing a semiconductor material to achieve a cooling effect of absorbing heat on one end and releasing heat on the other end. The passive cooling primarily relies on the heat conduction characteristics of a material itself or the latent heat absorbed by the phase change of a working fluid, so as to transfer the heat from a high-temperature place to low-temperature place. Common passive cooling includes cooling fins, heat pipes, vapor chambers, liquid cooling systems, etc. No matter thermoelectric cooling or passive cooling, it is necessary to use a heat conduction pad arranged between a heat source (such as a heating electronic component) and a cooling device to transfer the heat generated by the heat source to the cooling device to perform heat dissipation.

However, with the vigorous development of electronic components towards high performance, high speed, and small size, electronic components not only become smaller in size, but also generate more heat during operation. In addition, some electronic components (such as base station antennas) are installed outdoors due to the needs of use, so their cooling efficiency will be seriously affected due to being exposed to high temperature environment. The above factors make the heat conduction pad made of copper, aluminum or iron not enough to quickly transfer the heat to the cooling device for heat dissipation, or the cooling efficiency of the cooling device itself is not enough to cool down the heat quickly to result in heat accumulation leading to overheat.

In view of this, the inventors have devoted themselves to the above-mentioned prior art, researched intensively and cooperated with the application of science to try to solve the above-mentioned problems. Finally, the invention which is reasonable and effective to overcome the above drawbacks is provided.

SUMMARY

An object of the disclosure is to use the tungsten alloy cooling pad to rapidly disperse and transfer the heat of the heat source to the first substrate and transfer to the second substrate through each connecting column for cooling to avoid heat accumulation leading to overheat.

To accomplish the above object, the disclosure provides a cooling device for cooling a heat source. The cooling device includes a tungsten alloy cooling pad, a first substrate, a second substrate and multiple connecting columns. The tungsten alloy cooling pad is used for being attached on the heat source. The first substrate is parallelly superposed on the tungsten alloy cooling pad. The second substrate corresponds to the first substrate to be parallelly arranged. Each connecting column is perpendicularly connected between the first substrate and the second substrate. Each connecting column is arranged in a matrix.

In an embodiment of the disclosure, the tungsten alloy cooling pad is a tungsten-copper alloy, a tungsten-nickel-copper alloy or a tungsten-nickel-iron alloy.

In an embodiment of the disclosure, the connecting columns include multiple n-type bismuth telluride cylinders and multiple p-type bismuth telluride cylinders, which have the same amounts and are arranged interlacedly in rows, the first substrate comprises a first electrode, and the second substrate comprises a second electrode.

In an embodiment of the disclosure, each connecting column is arranged in a 4×5 matrix.

In an embodiment of the disclosure, each connecting column is arranged in a 4×4 matrix.

In an embodiment of the disclosure, each connecting column is arranged in a 3×6 matrix.

In an embodiment of the disclosure, each connecting column is arranged in a 4×6 matrix.

In an embodiment of the disclosure, the first substrate is directly and sealingly attached on the tungsten alloy cooling pad.

In an embodiment of the disclosure, the connecting columns are directly and sealingly attached on the first substrate and the second substrate.

In an embodiment of the disclosure, each of the first substrate and the second substrate is made of gold.

The cooling device of the disclosure uses the tungsten alloy cooling pad to be able to rapidly disperse and transfer the heat of the heat source to the first substrate and further transfer to the second substrate through each connecting column for cooling to satisfy the requirement of high heat dissipation during operation of a high-performance electronic component and to avoid heat accumulation leading to overheat.

DETAILED DESCRIPTION

Figure 1:
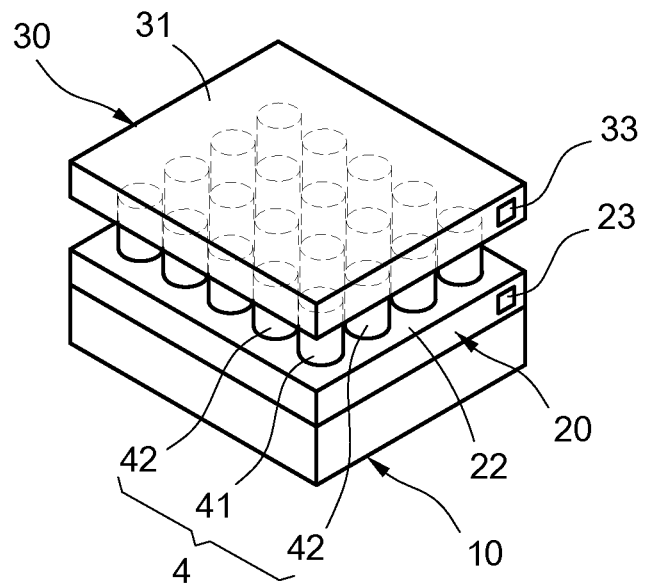
FIG. 1 is a perspective view of the disclosure.
Figure 2:
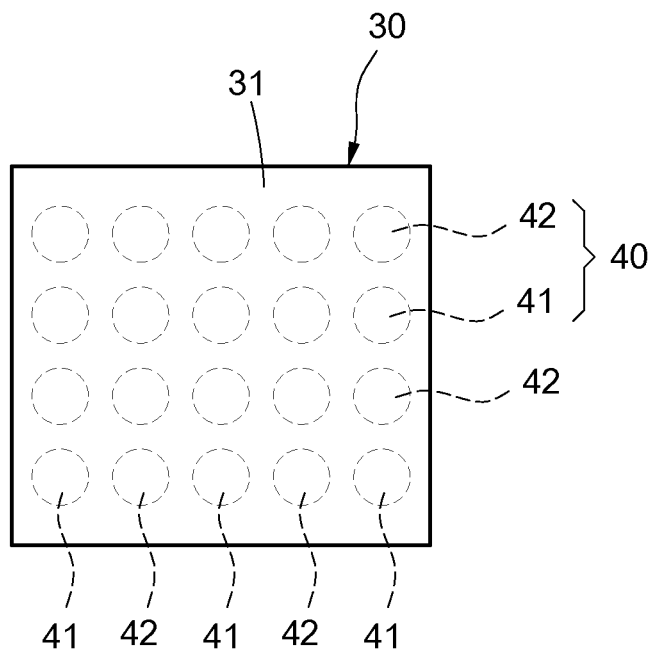
FIG. 2 is a top view of the disclosure.
Figure 3:
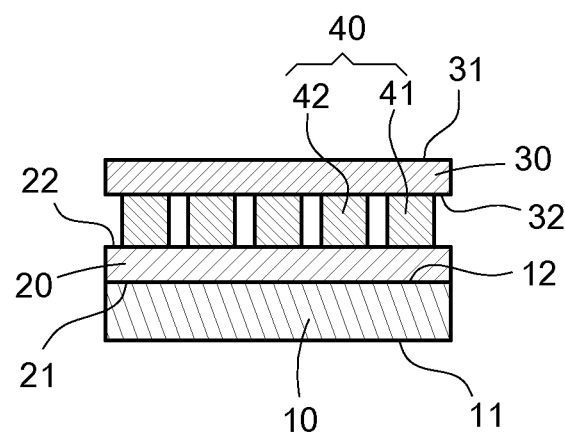
FIG. 3 is a cross-sectional view of the disclosure.
Figure 4:
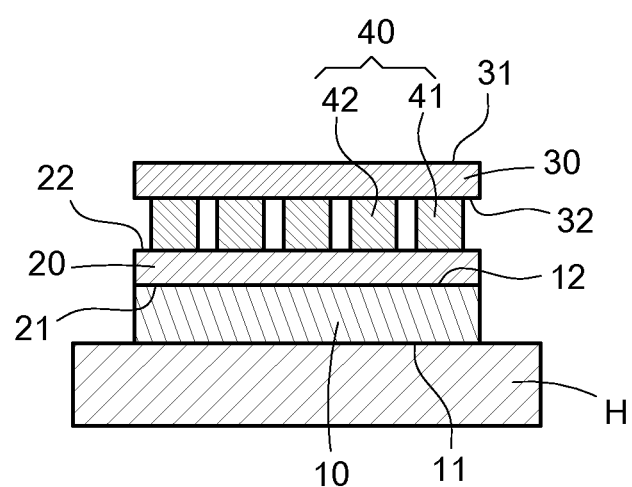
FIG. 4 is a cross-sectional view of the disclosure in a using status.

In the description of the disclosure, it is noted that the terms indicating directions or positional relationship such as "front side", "rear side", "left", "right", "front end", "rear end", "distal end", "longitudinal", "transverse", "perpendicular", "top" and "bottom", are based upon the directions or positional relationship shown in the figures. They are used to depict the disclosure and simplify the description but not to express or imply that the indicated devices or elements must have a specific direction or be constructed or operated in a specific direction. Thus, they should not be construed as limitations of the disclosure.

The terms used in the description, such as "first", "second", "third", "fourth" and "fifth", depict various elements, assemblies, regions, layers and/or portions. These elements, assemblies, regions, layers and/or portions should not be limited by the terms. These terms can only be used to distinguish an element, assembly, region, layer and/or portion from another one. Unless the context has expressively indicated, the terms, such as "first", "second", "third", "fourth" and "fifth", do not imply an order or sequence.

As used herein and not defined otherwise, the terms "substantially" and "approximately" are used to depict and describe small variations. When used in connection with an event or circumstance, the terms can include the exact moment at which the event or circumstance occurs, as well as the event or circumstance occurring to a close approximation point. For example, when associated with a value, the terms may include a range of variation less than or equal to ±10% of the value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

The technical contents of this disclosure will become apparent with the detailed description of embodiments accompanied with the illustration of related drawings as follows. It is intended that the embodiments and drawings disclosed herein are to be considered illustrative rather than restrictive.

The disclosure provides a cooling device used for cooling a heat source H. In the embodiment, the heat source H is a high-performance electronic component which generate a large amount of heat during operation, but the disclosure does limit this, any heating object which needs to be cooled may be an object cooled by the cooling device of the disclosure. Please refer to FIGS. 1-4. The cooling device of the disclosure includes a tungsten alloy cooling pad 10, a first substrate 20, a second substrate 30 and multiple connecting columns 40.

In the embodiment, the tungsten alloy cooling pad 10 is a tungsten-copper alloy, a tungsten-nickel-copper alloy or a tungsten-nickel-iron alloy to achieve an effect of heat conduction quicker than aluminum, iron, copper, gold or any one of the abovementioned alloys, but the disclosure is not limited to these, the tungsten alloy cooling pad 10 may also be a tungsten alloy with other elements. The tungsten alloy cooling pad 10 has a heated surface 11 and a heat transferring surface 12, which are opposite to each other. The tungsten alloy cooling pad 10 is used for being attached on the heat source H. In detail, the heated surface 11 of the tungsten alloy cooling pad 10 is directly and sealingly attached on the heat source H by a pressing package manner, so a medium which assists connection (such as thermal paste) is not required so as to avoid adding thermal resistance to affect the cooling effect.

The first substrate 20 has a heat absorbing surface 21 and a first connecting surface 22, which are opposite to each other. The first substrate 20 is parallelly superposed on the tungsten alloy cooling pad 10. In detail, the heat absorbing surface 21 of the first substrate 20 is directly and sealingly attached on the heat transferring surface 12 of the tungsten alloy cooling pad 10, so a medium which assists connection (such as thermal paste) is not required so as to avoid adding thermal resistance to affect the cooling effect.

The second substrate 30 has a cooling surface 31 and a second connecting surface 32, which are opposite to each other. The second substrate 30 is parallelly arranged correspondingly to the first substrate 20. In detail, the second connecting surface 32 of the second substrate 30 is arranged toward the first connecting surface 22 of the first substrate 20, and the first substrate 20 is located between the tungsten alloy cooling pad 10 and the second substrate 30. In the embodiment, each of the first substrate 20 and the second substrate 30 is made of, but not limited to, gold to achieve a thermoconductive and electro-conductive effect quicker than aluminum, iron or an alloy of any one of the abovementioned metals.

Each connecting column 40 is perpendicularly connected between the first substrate 20 and the second substrate 30. In detail, two ends of each connecting column 40 are directly and sealingly attached on the first connecting surface 22 of the first substrate 20 and the second connecting surface 32 of the second substrate 30, so a medium which assists connection (such as thermal paste) is not required so as to avoid adding thermal resistance to affect the cooling effect.

Figure 5:
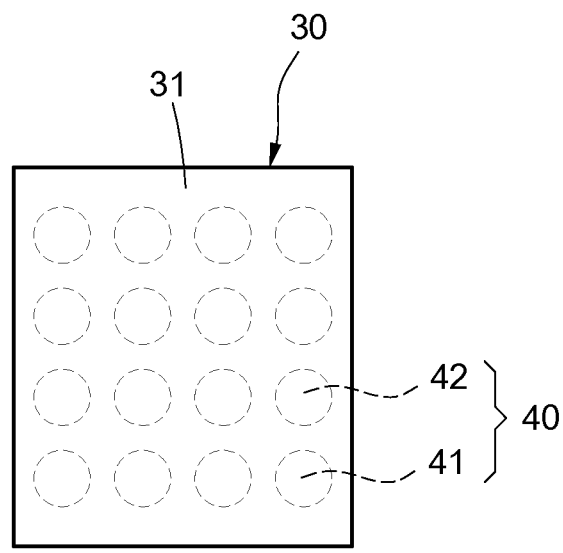
FIG. 5 is a top view of the disclosure when each connecting column is arranged in a 4×4 matrix.
Figure 6:
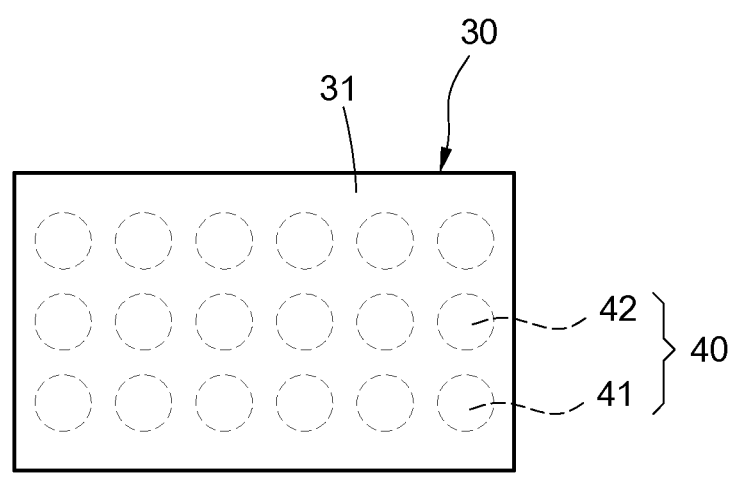
FIG. 6 is a top view of the disclosure when each connecting column is arranged in a 3×6 matrix.
Figure 7:
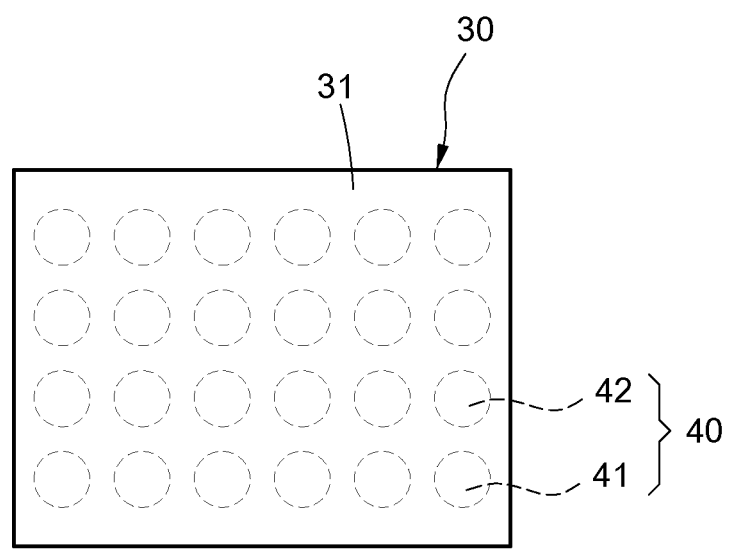
FIG. 7 is a top view of the disclosure when each connecting column is arranged in a 4×6 matrix.

Each connecting column 40 is arranged in a matrix. In detail, each connecting column 40 in the embodiment is arranged in, but not limited to, a 4×5 matrix. As shown in FIGS. 5-7, each connecting column 40 may also be arranged in a 4×4, 3×6 or 4×6 matrix, or any matrix with another size not shown in the figures. A person having ordinary skill in the art should be capable of correspondingly adjusting according to the sizes of the first connecting surface 22 and the second connecting surface 32 relative to the outer diameter of the connecting column 40.

Thereby, the cooling device of the disclosure uses the tungsten alloy cooling pad 10 directly and sealingly attached on the heat source H to be able to rapidly disperse and transfer the heat of the heat source H to the first substrate 20 and further transfer to the second substrate 30 through each connecting column 40 for cooling to satisfy the requirement of high heat dissipation during operation of a high-performance electronic component and to improve the drawback of the prior art having to dispose a medium such as thermal paste to add thermal resistance to affect the cooling effect.

In particular, thermoconductive efficiency of common traditional thermoconductive materials is described in order from high to low as follows: copper has a heat transfer coefficient of about 170 W/mK, gold has a heat transfer coefficient of about 152 W/mK, aluminum has a heat transfer coefficient of about 130 W/mK, and iron has a heat transfer coefficient of about 43 W/mK. The tungsten alloy adopted by the disclosure has a heat transfer coefficient of between 160 and 240 W/mK depending on the proportion of coper mixed, so that, in comparison with traditional thermoconductive materials such as aluminum, iron, copper and gold, it can conduct and dissipate heat more quickly to avoid heat accumulation leading to overheat.

Furthermore, each connecting column 40 in the embodiment includes multiple n-type bismuth telluride cylinders 41 and multiple p-type bismuth telluride cylinders 42, which have the same amounts and are arranged interlacedly in rows, the first substrate 20 has a first electrode 23, and the second substrate 30 has a second electrode 33. In detail, the n-type bismuth telluride cylinder 41 is n-type bismuth telluride with a cylindrical shape, wherein n-type bismuth telluride is bismuth telluride doped with selenium; the p-type bismuth telluride cylinder 42 is p-type bismuth telluride with a cylindrical shape, wherein p-type bismuth telluride is bismuth telluride doped with antimony. Thereby, when the cooling device of the disclosure electrically separately connects the first electrode 23 and the second electrode 33 to the positive and negative ends of an electric power source to form a loop, it can achieve the active cooling effect of thermoelectric cooling (TEC). That is, the Peltier effect is used to make the heat absorbing surface 21 of the first substrate 20 absorb heat to cool down the heat transferred by the tungsten alloy cooling pad 10. In addition, in other embodiments not shown in the figures, the cooling surface 31 of the second substrate 30 may also be disposed with multiple fins (not shown) to further enhance the cooling effect of passive heat dissipation.

While this disclosure has been described by means of specific embodiments, numerous modifications and variations could be made thereto by those skilled in the art without departing from the scope and spirit of this disclosure set forth in the claims.

What is claimed is:

1. A cooling device for cooling a heat source (H), the cooling device comprising:
   a tungsten alloy cooling pad (10), having a first surface (11) attached on the heat source (H) and a second surface (12) opposite to the first surface;
   a first substrate (20), parallelly superposed on the second surface (12) of the tungsten alloy cooling pad (10);
   a second substrate (30), corresponding to the first substrate (20) to be parallelly arranged; and
   multiple connecting columns (40), perpendicularly connected between the first substrate (20) and the second substrate (30), and each connecting column (40) being arranged in a matrix;
   wherein the tungsten alloy cooling pad (10) is configured to transfer heat of the heat source (H) to the first substrate (20), each connecting column (40), and the second substrate (30) sequentially for cooling.

2. The cooling device of claim 1, wherein the tungsten alloy cooling pad (10) is a tungsten-copper alloy, a tungsten-nickel-copper alloy or a tungsten-nickel-iron alloy.

3. The cooling device of claim 1, wherein the connecting columns (40) include multiple n-type bismuth telluride cylinders (41) and multiple p-type bismuth telluride cylinders (42) arranged interlacedly in rows, a number of the n-type bismuth telluride cylinders (41) and a number of the p-type bismuth telluride cylinders (42) are same, the first substrate comprises a first electrode (23), and the second substrate (30) comprises a second electrode (33).

4. The cooling device of claim 1, wherein each connecting column (40) is arranged in a 4×5 matrix.

5. The cooling device of claim 1, wherein each connecting column (40) is arranged in a 4×4 matrix.

6. The cooling device of claim 1, wherein each connecting column (40) is arranged in a 3×6 matrix.

7. The cooling device of claim 1, wherein each connecting column (40) is arranged in a 4×6 matrix.

8. The cooling device of claim 1, wherein the first substrate (20) is directly and sealingly attached on the tungsten alloy cooling pad (10).

9. The cooling device of claim 1, wherein the connecting columns (40) are directly and sealingly attached on the first substrate (20) and the second substrate (30).

10. The cooling device of claim 1, wherein each of the first substrate (20) and the second substrate (30) is made of gold.

* * * * *